United States Patent [19]

Jeon

[11] Patent Number: 5,920,761
[45] Date of Patent: *Jul. 6, 1999

[54] METHOD FOR FABRICATING CAPACITOR OF SEMICONDUCTOR DEVICE

[75] Inventor: Yoo Chan Jeon, Seoul-si, Rep. of Korea

[73] Assignee: LG Semicon Co., Ltd., Chungcheongbuk-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/648,687

[22] Filed: May 16, 1996

[30] Foreign Application Priority Data

Jan. 10, 1996 [KR] Rep. of Korea .......................... 96-372

[51] Int. Cl.$^6$ ...................... H01L 21/00; H01L 21/8242
[52] U.S. Cl. ................................. 438/3; 438/240
[58] Field of Search .................. 437/50, 52, 60, 437/919, 947; 156/644.1; 438/3, 210, 240, 253, 329, 396

[56] References Cited

U.S. PATENT DOCUMENTS

| | | | |
|---|---|---|---|
| 5,335,138 | 8/1994 | Sandhu | 361/303 |
| 5,534,458 | 7/1996 | Okudaira et al. | 437/52 |
| 5,622,893 | 4/1997 | Summerfelt et al. | 438/396 |
| 5,665,628 | 9/1997 | Summerfelt | 438/3 |

*Primary Examiner*—Joni Chang
*Attorney, Agent, or Firm*—Morgan, Lewis & Bockius LLP

[57] ABSTRACT

A method for fabricating a capacitor for a semiconductor device includes the steps of depositing an insulating layer on a substrate, selectively removing the insulating layer and forming a first contact hole, forming a conductive semiconductor layer in the contact hole to a predetermined depth, selectively removing the insulating layer adjacent the first contact hole and forming a second contact hole, forming a first electrode in the second contact hole, forming a dielectric thin film on the first electrode, and forming a second electrode on the dielectric thin film.

2 Claims, 8 Drawing Sheets

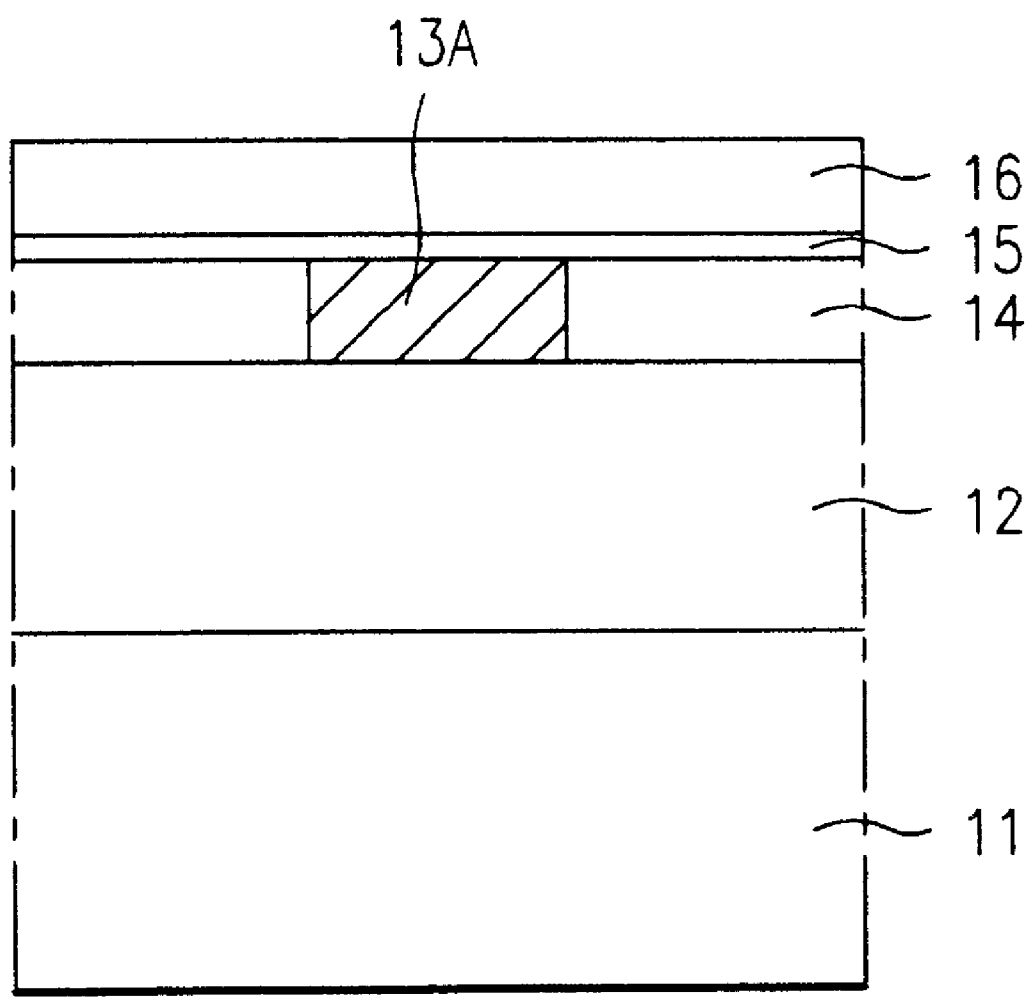

METHOD FOR FABRICATING CAPACITOR OF SEMICONDUCTOR DEVICE

BACKGROUND OF THE INVENTION

1. Field of the Invention

The present invention relates to a method for fabricating a capacitor, and more particularly, to a method for fabricating a capacitor for a semiconductor device. While the capacitor of the present invention is suited for a variety of applications, it is particularly suited for semiconductor DRAMs.

2. Discussion of the Related Art

Generally, as the packing density of a semiconductor device increases, the area of a capacitor of the semiconductor device becomes reduced, resulting in a capacitance reduction. In order to compensate for the reduced capacitance, the capacitor dielectric layer becomes thinner. However, as the thickness of the dielectric layer decreases, the leakage current due to tunneling increases. As a result, the reliability of the semiconductor device deteriorates.

In order to keep the dielectric layer from becoming too thin while maintaining its capacitance, a widely used method forms a capacitor with a rough surface to thereby increase the effective area of the capacitor. Another method is to use a nitride oxide layer or reoxidized nitride oxide layer having a high dielectric constant as a dielectric layer for the capacitor. However, these methods produce steps or unevenness on the surface of a semiconductor device making it difficult to apply a photolithography process. This in turn increases the production cost. Accordingly, it is difficult to apply there methods to highly integrated devices such as 256M DRAMs.

To increase the capacitance of a capacitor while reducing its surface roughness, one method is to use a material with a high dielectric constant as the dielectric layer for the capacitor. Accordingly, many studies concerning this technology have been performed. To date, the most widely studied material having a high dielectric constant is $Ta_2O_5$. A dielectric layer made of this material has several advantages such as thinning of the dielectric layer and improvement of the characteristics of the device. However, since the substantial dielectric constant of $Ta_2O_5$ is not very high, it will not be adequate for the new generations of highly integrated devices considering the trend of continual increase in packing density in the industry.

Recently, a perovskite-type oxide, such as a ferroelectric material, has become the center of studies as a dielectric to be used in semiconductor devices. The perovskite-type oxide includes $Pb(Zr,Ti)O_3(PZT)$, $(Pb,La)(Zr,Ti)O_3(PLZT)$, $(Ba,Sr)TiO_3(BST)$, $BaTiO_3$, and $SrTiO_3$. However, these materials easily react with silicon and silicide which form substrates. In addition, a strong oxidizing ambient is required during the formation of a thin film of those materials when oxidizing the electrode of the capacitor. Accordingly, studies to solve these fabrication-related problems have been carried out.

To form a conventional capacitor, after the formation of an electrode having a complicated structure, an oxide layer is usually formed on the surface of the electrode. Hence, there is no step coverage problem. Since the perovskite material includes various constituent elements, it is difficult to form a good quality perovskite film by oxidizing the electrode. Thus, it is often formed by using a chemical vapor deposition (CVD) method. Metal organic compounds may be used as a reaction source (including the required elements) for forming the perovskite film in a CVD method. Therefore, it is possible to fabricate a dielectric thin film through a metal organic chemical vapor deposition (MOCVD) method where the thin film is formed of metal organic compounds. Given its good step coverage, the CVD method is capable of depositing a material on a considerably uneven or rough surface of a substrate or in small holes. However, the CVD method is not suitable for forming a device having very small and deep holes.

Conventional capacitor structures for semiconductor devices and methods for fabricating the same will now be explained with reference to the accompanying drawings. FIGS. 1 and 2 are cross-sectional views of a conventional capacitor structure for semiconductor devices.

As shown in FIG. 1, an interlevel insulating layer 2 is formed on a substrate 1 on which a transistor (not shown) is formed, and a material for forming an electrode 3 is deposited on the interlevel Insulating layer 2. Then, the material is selectively removed through photolithography to form the electrode 3, and a dielectric layer 4 is formed on the overall surface of the electrode 3. However, if the dielectric layer 4 is formed to maintain its thickness on the overall surface of the substrate to a predetermined minimum thickness, the dielectric layer 4A becomes thicker on the horizontal surface of the electrode 3 than on the portion 4B where the electrode 3 was selectively removed. This is caused by a poor step coverage around small gaps, where the material for the electrode is selectively removed. Accordingly, a substantial capacitance is reduced.

Furthermore, the electrode 3 has a vertical surface at its edge so that a rectangular protrusion is formed at the portion where the horizontal surface and the vertical surface meet. Accordingly, the characteristics of the dielectric layer 4B formed on the rectangular protrusion portion become poor since the electric field is concentrated on the protrusion portion. This results in leakage current or deterioration of the device.

In an attempt to solve the above problem, U.S. Pat. No. 5,335,138 discloses a method in which sidewalls 5 are formed around the electrode 3 to remove the sharp protrusion portion, as shown in FIG. 2. However, if the sidewalls 5 are formed of a conductive material, the dielectric layer 4 will be formed nonuniformly. On the other hand, if the sidewalls 5 are formed of an insulative material, a substantial area of the electrode will be reduced. In addition, the number of depositing and etching processes increase to thereby raise the production cost.

Problems also arise when an MOCVD method is used to form the dielectric layer 4. Because a reaction source having a low steam pressure has to be used, the process is complicated. Moreover, since MOCVD has not been widely applied to actual production processes, it may have many unknown and unexpected problems.

The aforementioned problems can be solved by using a sputtering technique where a target with a well-adjusted constitution is used. This facilitates the adjustment of the constitution of the dielectric layer. In addition, since the sputtering technique has been widely used in the fabrication of semiconductor, it in easy to cope with any potential problems because such problems are more predictable. But on the other hand, since it is hard to carry out a conformal deposition by sputtering, it is difficult to apply sputtering to the fabrication of high-integration devices.

FIG. 3 is a cross-sectional view of a third conventional capacitor structure for a semiconductor device disclosed by Shinkawata et al. in "The 42nd Spring Meeting Extended Abstracts," The Japan Society of Applied Physics and Related Societies, p. 789, 1995. In this capacitor structure, a planarized electrode structure is formed and a dielectric layer is then formed using sputtering.

Referring to FIG. 3, a first insulating layer 12 is formed on a substrate 11, on which a transistor is formed (not shown). A lower electrode 13A is formed on the first insulating layer 12 and buried in a second insulating layer 14. A dielectric layer 15 is formed on the overall surface of the second insulating layer 14 and the lower electrode 13A. An upper electrode 16 is formed on the dielectric layer 15.

FIGS. 4a to 4d are cross-sectional views showing the fabricating process of the conventional capacitor of FIG. 3. As shown in FIG. 4a, a first insulating layer 12 is formed on a substrate 11, on which a transistor is formed (not shown). Next, a material 13 for forming an electrode is deposited on the first insulating layer 12. As shown in FIG. 4b, the material 13 is then selectively removed through photolithography to form a lower electrode 13A, and a second insulating layer 14 is formed on the lower electrode 13A and the first insulating layer 12. Here, the second insulating layer 14 is formed of silicon oxide.

As shown in FIG. 4c, the second insulating layer 14 is selectively removed by using chemical mechanical polishing (CMP) to expose the lower electrode 13A. Then, as shown in FIG. 4d, a dielectric layer 15 and an upper electrode 16 are sequentially formed on the lower electrode 13A and the second insulating layer 14.

However, this conventional method forms the electrode through photolithography, it is difficult to use this method with a material such as Pt. Even though Pt is one of the most widely used material for forming ferroelectric capacitors, it is difficult to etch, thus unsuitable for conventional methods.

SUMMARY OF THE INVENTION

Accordingly, the present invention is directed to a method for fabricating a capacitor for a semiconductor device that substantially obviates one or more of the problems due to limitations and disadvantages of the related art.

An object of the present invention is to provide a method for fabricating a capacitor for a semiconductor device so that various materials can be used as an electrode of the capacitor.

Another object of the present invention is to provide a method for fabricating a capacitor with a simplified fabrication process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a capacitor of a semiconductor device according to the present invention includes the steps of depositing an insulating layer on a substrate, selectively removing the insulating layer and forming a first contact hole, forming a conductive semiconductor layer in the contact hole to a predetermined depth, selectively removing the insulating layer adjacent the first contact hole and forming a second contact hole, forming a first electrode in the second contact hole, forming a dielectric thin film on the first electrode, and forming a second electrode on the dielectric thin film.

In another aspect, a method for fabricating a capacitor of a semiconductor device according to the present invention includes the steps of depositing an insulating layer on a substrate, selectively removing the insulating layer and forming a contact hole, forming a conductive semiconductor layer in the contact hole to a predetermined depth, forming a first electrode over the conductive semiconductor layer and in the contact hole, forming a dielectric thin film on the first electrode, and forming a second electrode on the dielectric thin film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings;

FIG. 3 is a cross-sectional view of a third conventional capacitor structure for a semiconductor device;

DETAILED DESCRIPTION OF THE PREFERRED EMBODIMENTS

Reference will now be made in detail to the preferred embodiments of the present invention, examples of which are illustrated in the accompanying drawings.

FIGS. 5a to 5f are cross-sectional views showing a fabricating process of a capacitor for a semiconductor device in accordance with a first embodiment of the present invention.

Figure 1:
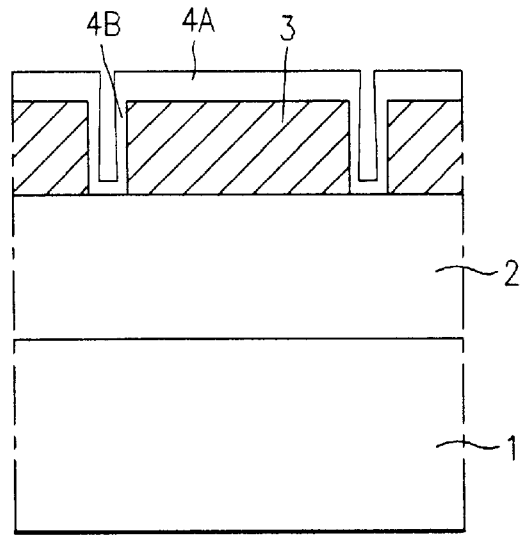
FIG. 1 is a cross-sectional view of a first conventional capacitor structure for a semiconductor device.
Figure 2:
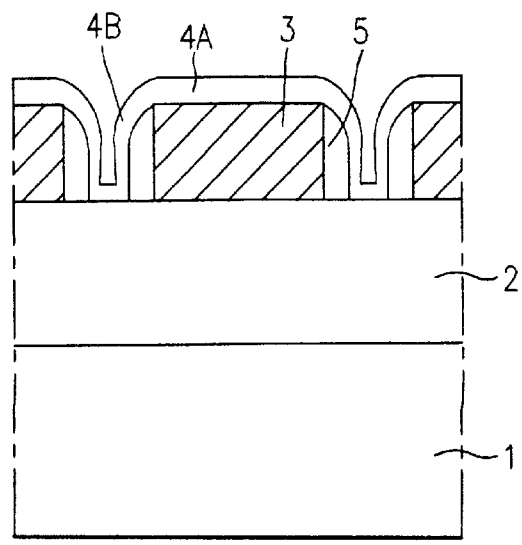
FIG. 2 is a cross-sectional view of a second conventional capacitor structure for a semiconductor device.
Figure 4A:
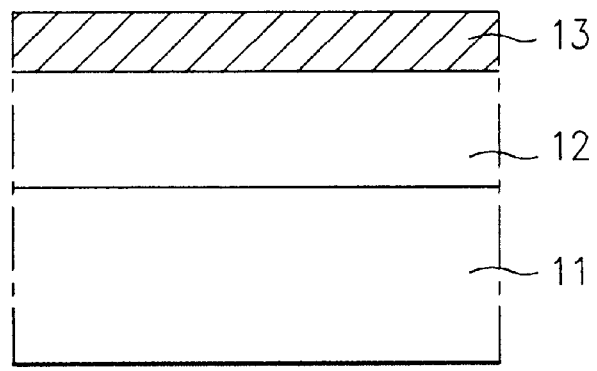
FIGS. 4a to 4d are cross-sectional views showing a fabricating process of the third conventional capacitor structure of FIG. 3.
Figure 4B:
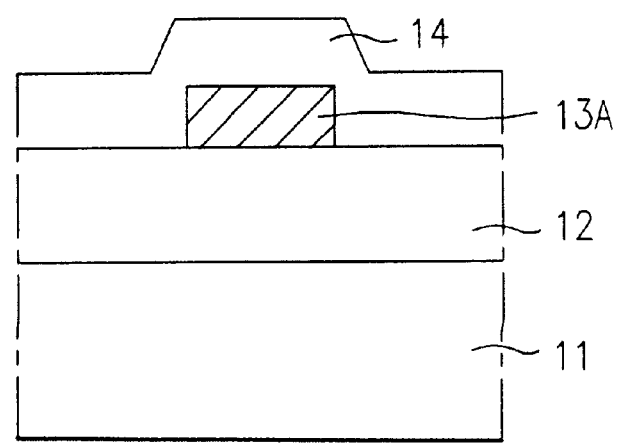
Figure 4C:
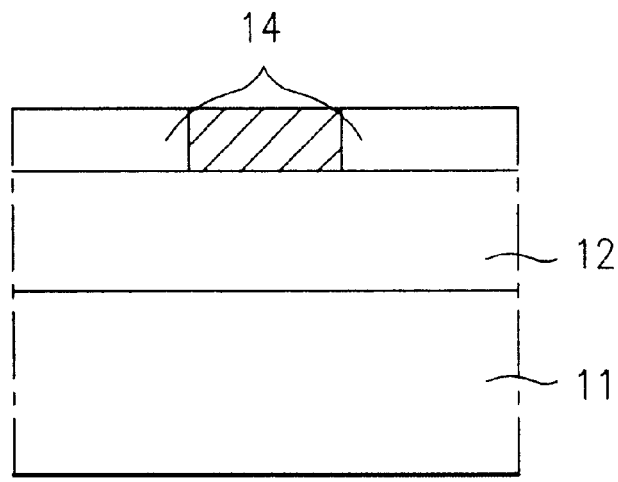
Figure 4D:
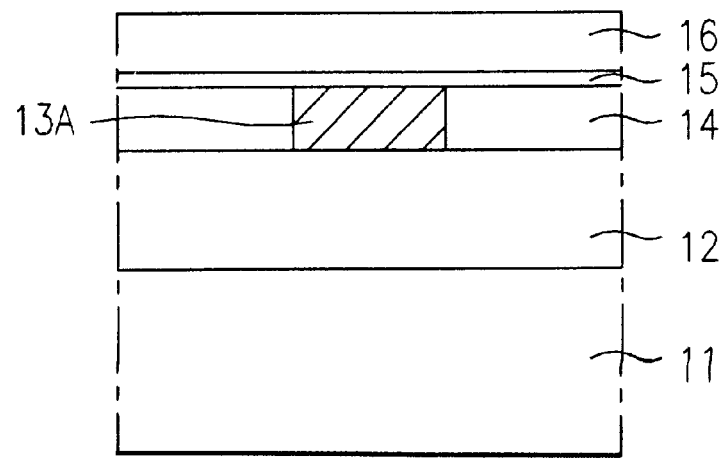
Figure 5A:
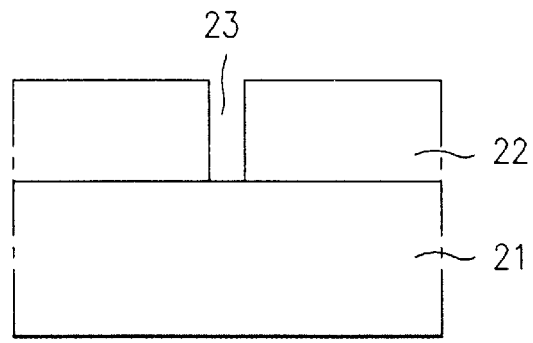
FIGS. 5a to 5f are cross-sectional views showing a fabricating process of a capacitor structure in accordance with a first embodiment of the present invention.

As shown in FIG. 5a, an interlevel insulating layer 22 is formed on a substrate 21. The interlevel insulating layer 22 is then selectively removed using photolithography to expose the substrate 21 to thereby form a contact hole 23. Preferably, a silicon oxide layer is used as the interlevel insulating layer 22. Also, a low pressure chemical vapor deposition (LPCVD) or an atmospheric pressure chemical vapor deposition (APCVD) are preferred deposition methods.

Figure 5B:
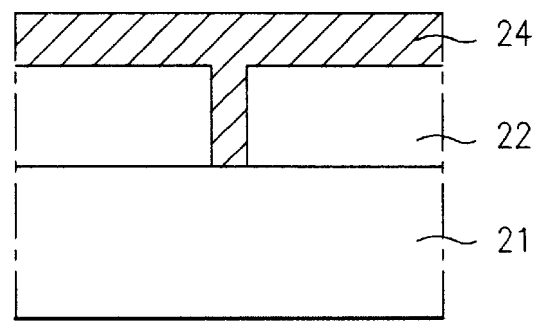
Figure 5C:
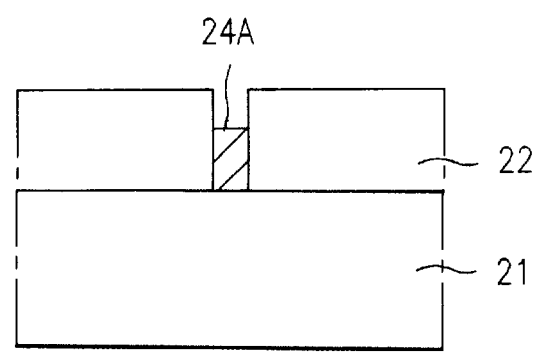

As shown in FIG. 5b, a polysilicon layer 24 is formed on the overall surface of the interlevel insulating layer 22 and substrate 21 including the contact hole 23. The polysilicon layer 24 is formed of phosphorus-doped polysilicon having excellent deposition characteristics and it does not react with the semiconductor substrate 21 (for a proper connection with a transistor, for example, of a semiconductor device).

Figure 5D:
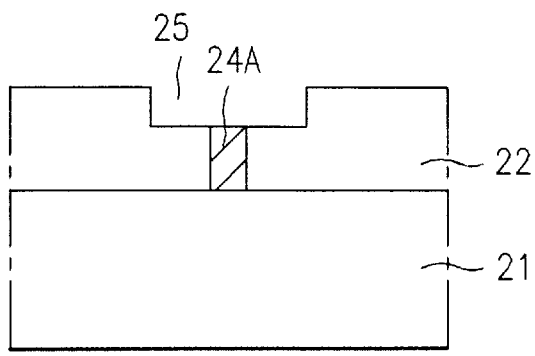

As shown in FIG. 5d, the polysilicon layer 24 is then etched back through a dry etching and the remaining portion 24A having a predetermined depth is maintained in the contact hole 23. Here, the surface of the remaining portion of the polysilicon layer 24A is about 1000 Å to 1500 Å lower than that of the interlevel insulating layer 22.

As shown in FIG. 5d, the interlevel insulating layer 22 is including the contact hole 23 is selectively removed through an anisotropic etching to form a recess region 25 where a lower electrode will be formed. The bottom of the recess region 25 is located on a same plane as the top surface of the polysilicon layer 24A.

Figure 5E:
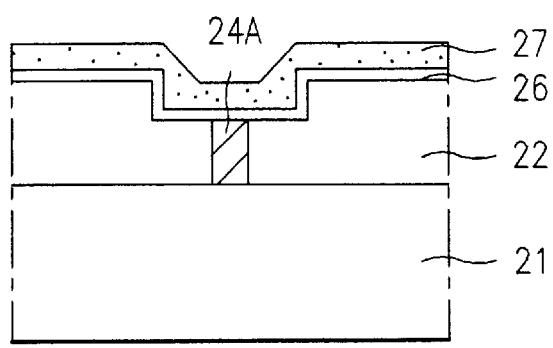

As shown in FIG. 5e, a diffusion stop layer 26 is formed on the overall surface of the interlevel insulating layer 22 including the recess region 25, and a lower electrode layer 27 is then formed on the diffusion stop layer 26. The diffusion stop layer 26 may be formed of TiN, Ta or Ti through sputtering, with a thickness of about 100 Å to 300 Å. The lower electrode layer 27 may be formed of Pt, Ir, Ru, $IrO_2$, $RuO_2$, $SrRuO_3$, $YBa_2Cu_3O_7$ or (La,Sr) $CoO_3$ through sputtering. These materials do not react with a dielectric layer formed of a material such as $(Ba,Sr)TiO_3$ and Pb (Zr, Ti)$O_3$.

The diffusion stop layer 26 may be selectively formed only over the polysilicon layer 24A, as described below. A Ti thin film is formed to a thickness of about 200 Å on the polysilicon layer 24A. A heat treatment in carried out at a temperature of about 800° C. for about one minute in an inert gas ambient, such as Ar, through rapid thermal processing (RTP), to thereby selectively form Ti-silicide only on the polysilicon layer 24A. Then, Ti, which does not react with the polysilicon layer and is left on the surface, is removed by using a wet etch, and RTP is performed at a temperature of about 800° C. for about one minute in a nitric ambient, such as $N_2$ and $NH_3$. By doing so, Ti-silicide is nitrified to form a TiN diffusion stop layer on the polysilicon layer 24A. Accordingly, it is possible to form the TiN diffusion stop layer only on the polysilicon layer 24A, without using complicated processes such as photolithography.

Figure 5F:
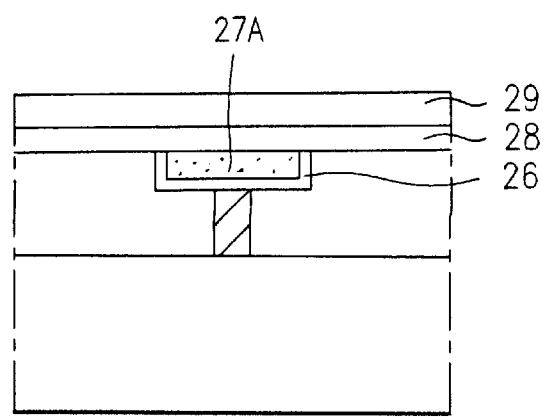

As shown in FIG. 5f, the lower electrode layer 27 is removed using CMP to expose the upper portion of the interlevel insulating layer 22, and to form the lower electrode 27A only in the recess region 25. Here, the surface of the lower electrode 27A and that of the interlevel insulating layer 22 are at the same level. Then, a dielectric thin film 28 having a high dielectric constant is formed on the overall surface of the interlevel insulating layer 22 including the lower electrode 27A. An upper electrode 29 is formed on the dielectric film 28. The dielectric thin film 28 may be formed of $(Ba,Sr)TiO_3$ or $Pb(Zr,Ti)O_3$ with a thickness of about 500 Å. The upper electrode 29 may be formed of Pt, $RuO_2$, (La,Sr)$CoO_3$, TiN or polysilicon.

FIGS. 6a to 6f are cross-sectional views showing a fabricating process of a capacitor for a semiconductor device in accordance with a second embodiment of the present invention.

Figure 6A:
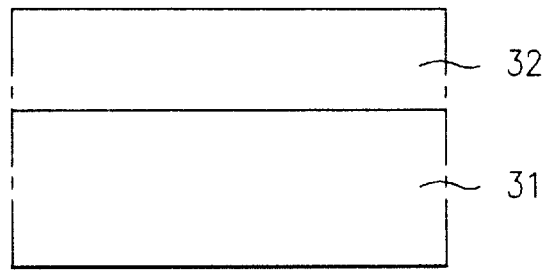
FIGS. 6a to 6f are cross-sectional views showing a fabricating process of a capacitor structure in accordance with a second embodiment of the present invention.
Figure 6B:
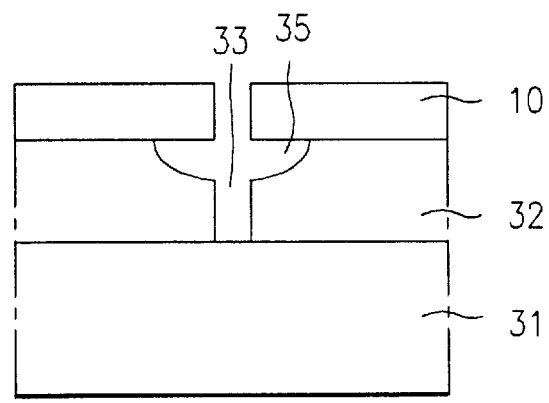

As shown in FIG. 6a, an interlevel insulating layer 32 is formed on a substrate 31. Then, as shown in FIG. 6b, the interlevel insulating layer 32 is selectively etched using photolithography to form a recess region 35 and a contact hole 33. More specifically, the interlevel insulating layer 32 is etched by an isotropic etching (such as wet etching or dry etching) using a predetermined resist pattern 10, to thereby form an under-cut portion beneath the resist pattern 10. As described above, the formation of the recess region 35 is caused by the under-cut portion so that a portion where an electrode will be formed is defined. Accordingly, the interlevel insulating layer 32 is formed with a sufficient thickness initially in consideration of the space needed for the undercut.

After forming the recess region 35, the interlevel insulating layer 32 is etched through an anisotropic etching such as a reactive ion etching (RIE) to expose the substrate 31. This forms a contact hole 33 in the shape of the resist pattern 10. In this way, the contact hole 33 and the recess region 35 can be formed by using photolithography only once.

Figure 6C:
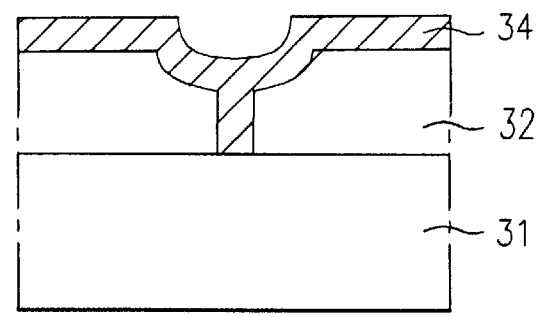
Figure 6D:
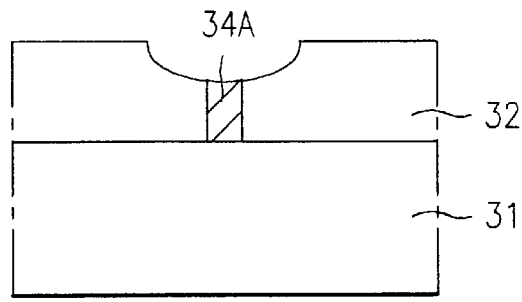

As shown in FIG. 6c, after removing the resist pattern 10, a polysilicon layer 34 is then deposited on the interlevel insulating layer 32 including the recess region 35 and the contact hole 33. Then, as shown in FIG. 6d, the polysilicon layer 34 is etched back leaving the polysilicon layer 34 only in the contact hole 35. This forms a polysilicon layer pattern 34A. The top surface of the polysilicon layer pattern 34A and the bottom of the recess region 35 are at the same level.

Figure 6E:
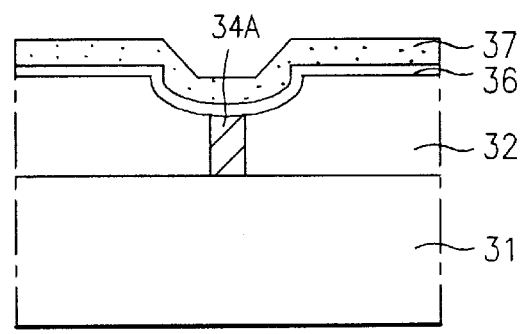
Figure 6F:
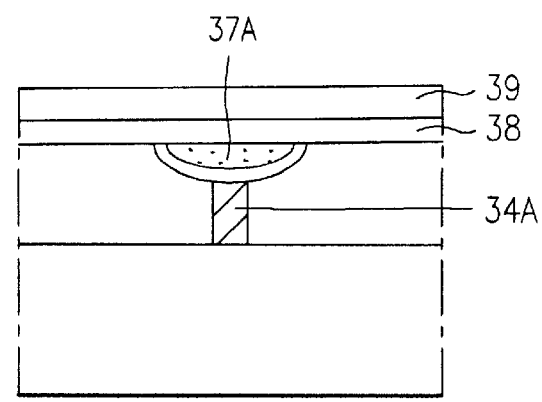

As shown in FIG. 6e, a diffusion stop layer 36 and a lower electrode layer 31 are sequentially formed on the overall surface of the interlevel insulating layer 32 including the recess region 35. As shown in FIG. 6f, the lower electrode layer 37 is partly removed using CMP to expose the upper portion of the interlevel insulating layer 32. By doing so, the surface of the lower electrode 37A in the recess region 33 and the surface of the interlevel insulating layer 32 are placed at the same level. Then, a dielectric thin film 38 having a high dielectric constant and an upper electrode 39 are sequentially formed on the overall surface of the interlevel insulating layer 32 including the lower electrode 37A.

Accordingly, the method for fabricating the capacitor of the semiconductor device according to the present invention has the following advantages.

First, in the aforementioned method of Shinkawata et. al., the lower electrode layer is etched and then buried in the insulating layer. Therefore, it is difficult to use a material such as Pt (the most widely used material for forming ferroelectric capacitors) in that method, since Pt is difficult to etch. In contrast, the present invention forms the lower electrode of the capacitor using an insulating layer that is easy to process. Also, the present invention forms the lower electrode without etching the lower electrode through photolithography. Therefore, even a precious metal which is difficult to etch, such as Pt, can be used for the lower electrode in the present invention.

Second, since a Pt electrode is difficult to etch as described above, etching such an electrode would redeposit separated portions of the Pt electrode on sidewalls of a resist pattern to form a thin protrusion portion. The present invention has no such problem because the Pt layer is removed using the CMP method.

Third, the conventional method produces surface steps between a cell region and a periphery circuit. Such a complicated surface structure requires photolithography with a high depth-of-focus, making a successive process difficult. The present invention does not form such steps during the fabrication of the capacitor, and thus there is no such difficulty in applying photolithography. Moveover, any step already formed can be removed using the CMP method.

Fourth, the present invention produces uniform structure and thickness for the respective capacitors. This reduces the thickness of the dielectric layer to a minimum while assuring reliability, thus substantially increasing the capacitance. In addition, if other electrodes are formed on the dielectric layer, even though the size of the capacitor and the space between the capacitors are very small, there will not be interference problems between the respective capacitors.

Fifth, the present invention produces a flat surface electrode. Accordingly, it is possible to form a thin film having a high dielectric constant or a ferroelectric thin film on the flat surface of the electrode using a sputtering technique which works well for low step coverage. Also, a material difficult to deposit by CVD can be deposited through a physical deposition method such as sputtering. Thus, the present invention forms the electrode easily and a wide range of material can be used for forming the electrode.

It will be apparent to those skilled in the art that various modifications and variations can be made in the method for fabricating capacitor of semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a capacitor for a semiconductor device comprising the steps of:

depositing an insulating layer on a substrate;

selectively removing the insulating layer to form a first contact hole;

forming a first conductive layer in the first contact hole, wherein a top surface of the first conductive layer is approximately 1000 to 1500 angstroms lower than a top surface of the insulating layer;

selectively removing the insulating layer around a top of the first contact hole to form a second contact hole larger than the first contact hole;

carrying out a heat treatment to selectively form a silicide layer only on the first conductive layer;

selectively forming a diffusion stop layer only on the first conductive layer;

forming a first electrode over the silicide layer;

forming a dielectric thin film on the first electrode; and forming a second electrode on the dielectric thin film, wherein the first electrode is selected from one of $IrO_2$, $SrRuO_3$, $YBa_2Cu_3O_7$ and $(La, Sr)CoO_3$.

2. A method for fabricating a capacitor comprising the steps of:

depositing an insulating layer on a substrate;

forming a patterned resist layer over the insulating layer;

selectively removing the insulating layer and forming a contact hole having a first portion and a second portion, the second portion forming an under-cut portion beneath the patterned resist layer;

removing the patterned resist layer;

depositing a first conductive layer in the first portion of the contact hole;

forming a silicide layer only on the first conductive layer and on no other layer;

selectively forming a diffusion stop layer only on the first conductive layer;

forming a first electrode on the diffusion stop layer;

forming a dielectric film on the first electrode; and forming a second electrode on the dielectric film, wherein the first electrode is selected from one of Ir, Ru, $IrO_2$, $SrRuO_3$, $YBa_2Cu_3O_7$ and $(La, Sr)CoO_3$.

* * * * *